(12) United States Patent
Salter et al.

(10) Patent No.: US 9,625,115 B2
(45) Date of Patent: Apr. 18, 2017

(54) PHOTOLUMINESCENT VEHICLE GRAPHICS

(71) Applicant: Ford Global Technologies, LLC, Dearborn, MI (US)

(72) Inventors: Stuart C. Salter, White Lake, MI (US); James J. Surman, Clinton Township, MI (US); Cornel Lewis Gardner, Romulus, MI (US); Paul Kenneth Dellock, Northville, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 405 days.

(21) Appl. No.: 14/502,039

(22) Filed: Sep. 30, 2014

(65) Prior Publication Data

US 2015/0197187 A1 Jul. 16, 2015

Related U.S. Application Data

(63) Continuation-in-part of application No. 14/452,893, filed on Aug. 6, 2014, which is a continuation-in-part (Continued)

(51) Int. Cl.

| | |
|---|---|
| *F21V 1/00* | (2006.01) |
| *F21S 8/10* | (2006.01) |
| *B60Q 1/32* | (2006.01) |
| *G09F 13/22* | (2006.01) |
| *G09F 21/04* | (2006.01) |
| *H01L 33/50* | (2010.01) |

(52) U.S. Cl.
CPC ............ *F21S 48/214* (2013.01); *B60Q 1/323* (2013.01); *G09F 13/22* (2013.01); *G09F 21/048* (2013.01); *H01L 33/507* (2013.01)

(58) Field of Classification Search
CPC ...... B60Q 1/323; F21S 48/214; F21S 48/215; F21S 48/218; G09F 13/22; G09F 21/048; G09F 2013/222
USPC ................. 362/487, 509–510, 540, 543–545
See application file for complete search history.

(56) References Cited

U.S. PATENT DOCUMENTS

| | | |
|---|---|---|
| 5,709,453 A | 1/1998 | Krent et al. |
| 6,031,511 A | 2/2000 | DeLuca et al. |
| (Continued) | | |

FOREIGN PATENT DOCUMENTS

| | | |
|---|---|---|
| CN | 201169230 Y | 12/2008 |
| CN | 101337492 A | 1/2009 |
| (Continued) | | |

*Primary Examiner* — Jason Moon Han
(74) *Attorney, Agent, or Firm* — Jason Rogers; Price Heneveld LLP

(57) ABSTRACT

An illumination apparatus for a vehicle is disclosed. The illumination apparatus comprises a surface comprising a first photoluminescent graphic comprising a first absorption range and a second photoluminescent graphic comprising a second absorption range. The illumination apparatus further comprises at least one light source configured to emit a first emission at a first wavelength. The first wavelength is substantially aligned with the first absorption range to generate a higher level of fluorescence from the photoluminescent first graphic than the second photoluminescent graphic. In this way, the illumination apparatus is operable to selectively illuminate the first photoluminescent graphic and the second photoluminescent graphic substantially independently.

20 Claims, 10 Drawing Sheets

Related U.S. Application Data of application No. 14/301,635, filed on Jun. 11, 2014, now Pat. No. 9,499,096, which is a continuation-in-part of application No. 14/156,869, filed on Jan. 16, 2014, now Pat. No. 9,440,583, which is a continuation-in-part of application No. 14/086,442, filed on Nov. 21, 2013.

(56) References Cited

U.S. PATENT DOCUMENTS

| | | |
|---|---|---|
| 6,117,362 A | 9/2000 | Yen et al. |
| 6,494,490 B1 | 12/2002 | Trantoul |
| 6,572,784 B1 | 6/2003 | Coombs et al. |
| 6,577,073 B2 | 6/2003 | Shimizu et al. |
| 6,729,738 B2 | 5/2004 | Fuwausa et al. |
| 6,737,964 B2 | 5/2004 | Samman et al. |
| 6,773,129 B2 | 8/2004 | Anderson, Jr. et al. |
| 6,820,888 B1 | 11/2004 | Griffin |
| 6,851,840 B2 | 2/2005 | Ramamurthy et al. |
| 6,859,148 B2 | 2/2005 | Miller |
| 6,871,986 B2 | 3/2005 | Yamanaka et al. |
| 6,953,536 B2 | 10/2005 | Yen et al. |
| 6,990,922 B2 | 1/2006 | Ichikawa et al. |
| 7,134,773 B2 | 11/2006 | Tufte |
| 7,161,472 B2 | 1/2007 | Strumolo et al. |
| 7,213,923 B2 | 5/2007 | Liu et al. |
| 7,264,366 B2 | 9/2007 | Hulse |
| 7,264,367 B2 | 9/2007 | Hulse |
| 7,401,949 B2 | 7/2008 | Tufte |
| 7,441,914 B2 | 10/2008 | Palmer et al. |
| 7,501,749 B2 | 3/2009 | Takeda et al. |
| 7,575,349 B2 | 8/2009 | Bucher et al. |
| 7,745,818 B2 | 6/2010 | Sofue et al. |
| 7,753,541 B2 | 7/2010 | Chen et al. |
| 7,834,548 B2 | 11/2010 | Jousse et al. |
| 7,862,220 B2 | 1/2011 | Cannon et al. |
| 7,987,030 B2 | 7/2011 | Flores et al. |
| 8,016,465 B2 | 9/2011 | Egerer et al. |
| 8,022,818 B2 | 9/2011 | la Tendresse et al. |
| 8,066,416 B2 | 11/2011 | Bucher |
| 8,071,988 B2 | 12/2011 | Lee et al. |
| 8,097,843 B2 | 1/2012 | Agrawal et al. |
| 8,136,425 B2 | 3/2012 | Bostick |
| 8,163,201 B2 | 4/2012 | Agrawal et al. |
| 8,178,852 B2 | 5/2012 | Kingsley et al. |
| 8,197,105 B2 | 6/2012 | Yang |
| 8,203,260 B2 | 6/2012 | Li et al. |
| 8,207,511 B2 | 6/2012 | Bortz et al. |
| 8,232,533 B2 | 7/2012 | Kingsley et al. |
| 8,247,761 B1 | 8/2012 | Agrawal et al. |
| 8,286,378 B2 | 10/2012 | Martin et al. |
| 8,355,169 B2 | 1/2013 | Hersch et al. |
| 8,408,766 B2 | 4/2013 | Wilson et al. |
| 8,415,642 B2 | 4/2013 | Kingsley et al. |
| 8,421,811 B2 | 4/2013 | Odland et al. |
| 8,466,438 B2 | 6/2013 | Lambert et al. |
| 8,519,359 B2 | 8/2013 | Kingsley et al. |
| 8,519,362 B2 | 8/2013 | Labrot et al. |
| 8,552,848 B2 | 10/2013 | Rao et al. |
| 8,606,430 B2 | 12/2013 | Seder et al. |
| 8,624,716 B2 | 1/2014 | Englander |
| 8,631,598 B2 | 1/2014 | Li et al. |
| 8,647,704 B2 | 2/2014 | Dain |
| 8,664,624 B2 | 3/2014 | Kingsley et al. |
| 8,683,722 B1 | 4/2014 | Cowan |
| 8,724,054 B2 | 5/2014 | Jones |
| 8,754,426 B2 | 6/2014 | Marx et al. |
| 8,773,012 B2 | 7/2014 | Ryu et al. |
| 8,846,184 B2 | 9/2014 | Agrawal et al. |
| 8,876,352 B2 | 11/2014 | Robbins et al. |
| 8,952,341 B2 | 2/2015 | Kingsley et al. |
| 9,006,751 B2 | 4/2015 | Kleo et al. |
| 9,018,833 B2 | 4/2015 | Lowenthal et al. |
| 9,057,021 B2 | 6/2015 | Kingsley et al. |
| 9,065,447 B2 | 6/2015 | Buttolo et al. |
| 9,187,034 B2 | 11/2015 | Tarahomi et al. |
| 9,299,887 B2 | 3/2016 | Lowenthal et al. |
| 2002/0159741 A1 | 10/2002 | Graves et al. |
| 2002/0163792 A1 | 11/2002 | Formoso |
| 2003/0167668 A1 | 9/2003 | Fuks et al. |
| 2003/0179548 A1 | 9/2003 | Becker et al. |
| 2004/0213088 A1 | 10/2004 | Fuwausa |
| 2006/0087826 A1 | 4/2006 | Anderson, Jr. |
| 2006/0097121 A1 | 5/2006 | Fugate |
| 2007/0032319 A1 | 2/2007 | Tufte |
| 2007/0285938 A1 | 12/2007 | Palmer et al. |
| 2009/0219730 A1 | 9/2009 | Syfert et al. |
| 2009/0251920 A1 | 10/2009 | Kino et al. |
| 2009/0260562 A1 | 10/2009 | Folstad et al. |
| 2009/0262515 A1 | 10/2009 | Lee et al. |
| 2011/0012062 A1 | 1/2011 | Agrawal et al. |
| 2012/0001406 A1 | 1/2012 | Paxton et al. |
| 2012/0064134 A1 | 3/2012 | Bourke, Jr. et al. |
| 2012/0104954 A1 | 5/2012 | Huang |
| 2012/0183677 A1 | 7/2012 | Agrawal et al. |
| 2012/0280528 A1 | 11/2012 | Dellock et al. |
| 2013/0335994 A1 | 12/2013 | Mulder et al. |
| 2014/0029281 A1 | 1/2014 | Suckling et al. |
| 2014/0065442 A1 | 3/2014 | Kingsley et al. |
| 2014/0103258 A1 | 4/2014 | Agrawal et al. |
| 2014/0264396 A1 | 9/2014 | Lowenthal et al. |
| 2014/0266666 A1 | 9/2014 | Habibi |
| 2014/0373898 A1 | 12/2014 | Rogers et al. |
| 2015/0046027 A1 | 2/2015 | Sura et al. |
| 2015/0138789 A1 | 5/2015 | Singer et al. |
| 2015/0267881 A1 | 9/2015 | Salter et al. |
| 2016/0016506 A1 | 1/2016 | Collins et al. |

FOREIGN PATENT DOCUMENTS

| | | |
|---|---|---|
| CN | 201193011 Y | 2/2009 |
| DE | 29708699 U1 | 7/1997 |
| DE | 10319396 A1 | 11/2004 |
| EP | 1793261 A1 | 6/2007 |
| EP | 2778209 A1 | 9/2014 |
| JP | 2000159011 A | 6/2000 |
| JP | 2007238063 A | 9/2007 |
| WO | 2006047306 A1 | 5/2006 |
| WO | 2014068440 A1 | 5/2014 |

PHOTOLUMINESCENT VEHICLE GRAPHICS

CROSS-REFERENCE TO RELATED APPLICATIONS

This application is a continuation-in-part of U.S. patent application Ser. No. 14/452,893, filed Aug. 6, 2014, and entitled "INTERIOR EXTERIOR MOVING DESIGNS," which is a continuation-in-part of U.S. Pat. No. 9,499,096, filed Jun. 11, 2014, and entitled "PHOTOLUMINESCENT VEHICLE READING LAMP," which is a continuation-in-part of U.S. Pat. No. 9,440,583, filed on Jan. 16, 2014, entitled "VEHICLE DOME LIGHTING SYSTEM WITH PHOTOLUMINESCENT STRUCTURE," which is a continuation-in-part of U.S. patent application Ser. No. 14/086,442, filed Nov. 21, 2013, and entitled "VEHICLE LIGHTING SYSTEM WITH PHOTOLUMINESCENT STRUCTURE." The aforementioned related applications are hereby incorporated by reference in their entirety.

FIELD OF THE INVENTION

The present disclosure generally relates to vehicle lighting systems, and more particularly, to vehicle lighting systems employing photoluminescent structures.

BACKGROUND OF THE INVENTION

Illumination arising from photoluminescent materials offers a unique and attractive viewing experience. It is therefore desired to incorporate such photoluminescent materials in portions of vehicles to provide ambient and task lighting.

SUMMARY OF THE INVENTION

According to one aspect of the present invention, an illumination apparatus for a vehicle is disclosed. The illumination apparatus comprises a surface comprising a first photoluminescent graphic comprising a first absorption range and a second photoluminescent graphic comprising a second absorption range. The illumination apparatus further comprises at least one light source configured to emit a first emission at a first wavelength. The first wavelength is substantially aligned with the first absorption range to generate a higher level of fluorescence from the first photoluminescent graphic than the second photoluminescent graphic. In this way, the illumination apparatus is operable to selectively illuminate the first photoluminescent graphic and the second photoluminescent graphic substantially independently.

According to another aspect of the present invention, a lighting system for a vehicle is disclosed. The lighting system comprises a panel corresponding to a surface of the vehicle and at least one light source configured to emit a first emission. A coating is disposed on the surface proximate the at least one light source. The coating comprises at least one photoluminescent portion extending along the surface, wherein the first emission is directed toward the photoluminescent portion such that the photoluminescent portion emits a second emission.

According to yet another aspect of the present invention, a lighting system for a vehicle is disclosed. The lighting system comprises a first light source configured to emit a first emission and a first photoluminescent graphic comprising a first absorption range disposed on a surface. The illumination apparatus further comprises a second photoluminescent graphic comprising a second absorption range disposed on the surface. The first light source is directed toward at least a portion of each of the first photoluminescent graphic and the second photoluminescent graphic. The light source is configured to excite the first photoluminescent graphic to output a second emission at a greater fluorescence than the second photoluminescent graphic in response to the first emission.

These and other aspects, objects, and features of the present invention will be understood and appreciated by those skilled in the art upon studying the following specification, claims, and appended drawings.

DETAILED DESCRIPTION OF THE PREFERRED EMBODIMENTS

Figure 1:
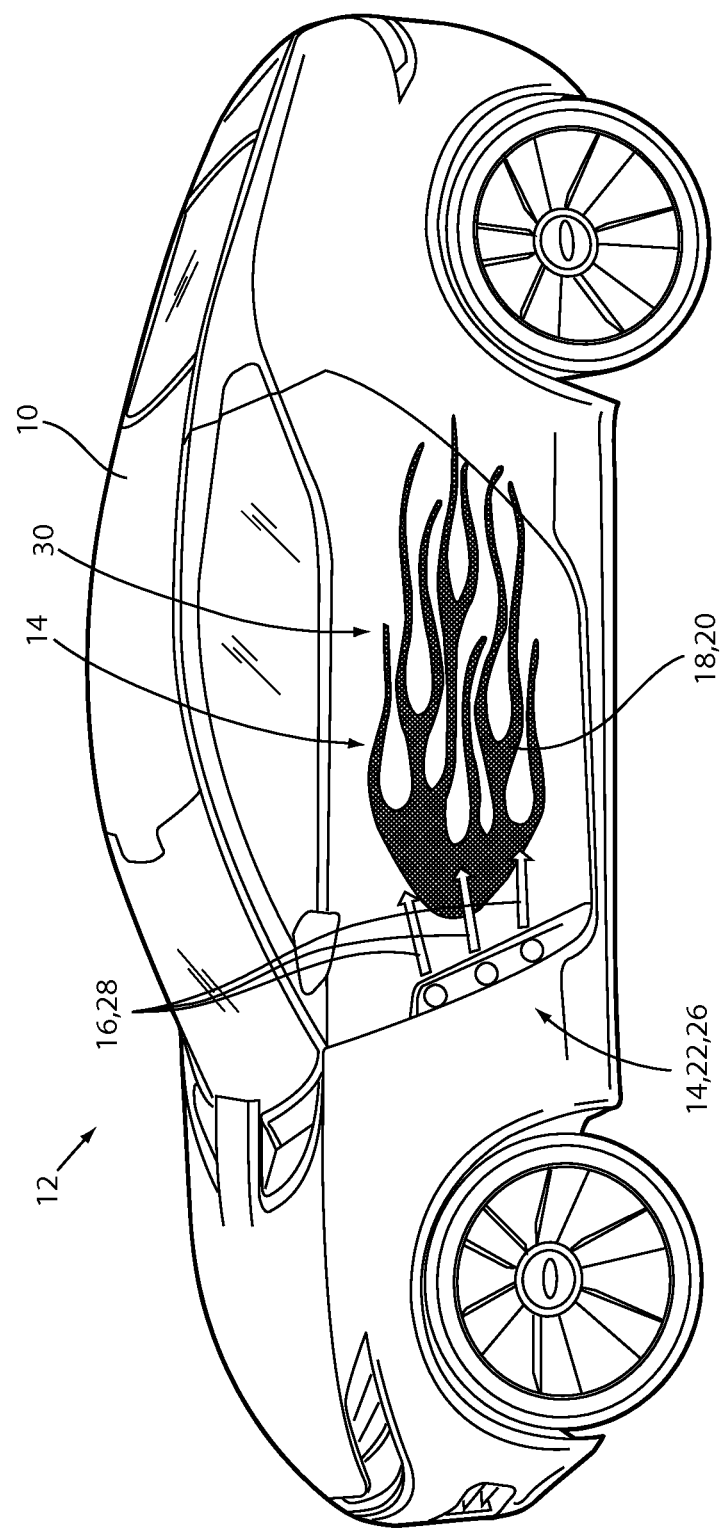
FIG. 1 is a perspective view of a vehicle comprising a lighting system configured to generate motion effect.

As required, detailed embodiments of the present disclosure are disclosed herein. However, it is to be understood that the disclosed embodiments are merely exemplary of the disclosure that may be embodied in various and alternative forms. The figures are not necessarily to a detailed design and some schematics may be exaggerated or minimized to show function overview. Therefore, specific structural and functional details disclosed herein are not to be interpreted as limiting, but merely as a representative basis for teaching one skilled in the art to variously employ the present disclosure.

As used herein, the term "and/or," when used in a list of two or more items, means that any one of the listed items can be employed by itself, or any combination of two or more of the listed items can be employed. For example, if a composition is described as containing components A, B, and/or C, the composition can contain A alone; B alone; C alone; A and B in combination; A and C in combination; B and C in combination; or A, B, and C in combination.

The terms first, second, third, etc. as utilized herein may provide designations in reference to the figures for clarity. For example, a first portion and a second portion may be referred to in some implementations and only a second portion may be referred to in some additional implementations. Such designations may serve to demonstrate exemplary arrangements and compositions and should not be considered to designate a specific number of elements or essential components of any specific implementation of the disclosure, unless clearly specified otherwise. These designations, therefore, should be considered to provide clarity in reference to various possible implementations of the disclosure which may be combined in various combinations and/or individually utilized to clearly reference various elements of the disclosure.

The following disclosure describes a lighting system for a vehicle configured to illuminate a first photoluminescent portion of at least one vehicle panel having a first luminescent absorption range. The first light source is configured to emit a first emission of light having a first wavelength corresponding to the first luminescent absorption range. In response receiving the first emission, the first photoluminescent portion is configured to emit a second emission. The second emission has a second wavelength that differs from the first wavelength in that the second wavelength is longer and more acutely visible to the human eye. In this configuration, the lighting system provides for illumination of the first photoluminescent portion from the first light source.

In some implementations, the lighting system further includes a second light source and a second photoluminescent portion having a second luminescent absorption range. The second light source is configured to emit a third emission having a third wavelength corresponding to the second photoluminescent portion. In response to receiving the third emission, the second photoluminescent portion is configured to emit a fourth emission. The lighting system is operable to generate a perceived motion effect or animation by selectively illuminating the first light source and the second light source to generate the second and fourth emission from the first and second photoluminescent portions, respectively.

The motion effect or animation as discussed herein refers to a perceived visual effect that may result at least partially due to a persistence of motion phenomenon. For example, as the first and second light sources alternate emitting the first and third emission of light, the first and second photoluminescent portions may selectively illuminate and emit the second and fourth emissions of light. By alternating between outputting the second and fourth emissions of light, the lighting system is operable to generate a motion effect corresponding to the spatial relationship between the first and second photoluminescent portions. The motion effect may correspond to a flickering, oscillating, and/or animated sequence configured to generate a moving design and/or graphic on the vehicle.

Referring to FIG. 1, a perspective view of a vehicle 10 comprising a lighting system 12 configured to generate motion effect is shown. The lighting system 12 comprises at least one light source 14 configured to emit a first emission 16 having a first wavelength. The lighting system 12 further comprises at least one photoluminescent portion 18 configured to emit a second emission 20 having a second wavelength. The second emission 20 causes the at least one photoluminescent portion 18 to have an ambient glow having a color corresponding to one or more wavelengths corresponding to the second wavelength. The at least one photoluminescent portion 18 may comprise at least one photoluminescent structure that is excited in response to receiving the first emission 16 and converts the first wavelength to the second wavelength to illuminate the at least one photoluminescent portion 18.

The at least one photoluminescent portion 18 may correspond to a plurality of photoluminescent portions. Similarly, the at least one light source 14 may correspond to a plurality of light sources. In some implementations, each of the plurality of light sources is configured to correspond to each of the photoluminescent portions to illuminate a corresponding photoluminescent portion. For example, a first light source 22 may correspond to a first photoluminescent portion 24. The first light source 22 may be configured to emit the first emission 16 such that the first photoluminescent portion 24 becomes excited and converts the first emission 16 to a second emission 20 having a second wavelength.

In some implementations, a second light source 26 may be configured to emit a third emission 28 corresponding to a second photoluminescent portion 30. The second light source 26 may correspond to one of the plurality of light sources demonstrated in FIG. 1 as the at least one light source 14. The second photoluminescent portion 30 may correspond to one of the plurality of photoluminescent portions demonstrated in FIG. 1 as the at least one photoluminescent portion 18. In some implementations, the second photoluminescent portion 30 may be configured to have a form or shape that complements the first photoluminescent portion 24, for example a shadow, accent, and/or any form configured to generate a blur or motion effect offset relative to the first photoluminescent portion 24.

To generate the motion effect or accent, the second photoluminescent portion 30 is configured to become excited and convert the third emission 28 to a fourth emission 32 having a fourth wavelength. In this way, the disclosure provides for the lighting system 12 to be operable to selectively illuminate the first photoluminescent portion 24 and the second photoluminescent portion 30 to generate a motion animation effect. The second light source 26 and the second photoluminescent portion 30 may be disposed on the vehicle 10 similar to the at least one light source 14 and the at least one photoluminescent portion 18, respectively.

Further discussion of the pluralities of light sources and photoluminescent portions are discussed herein, particularly in reference to FIGS. 6A-7B.

Figure 2A:
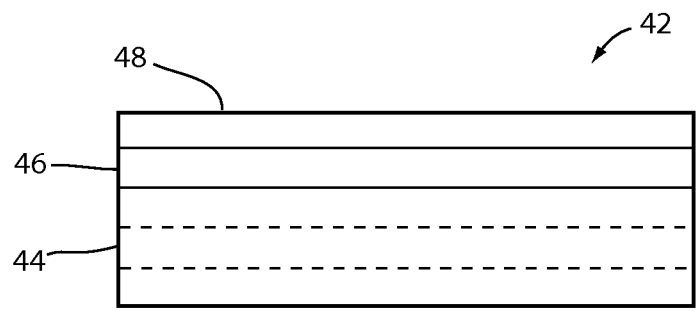
FIG. 2A illustrates a photoluminescent structure rendered as a coating.
Figure 2B:
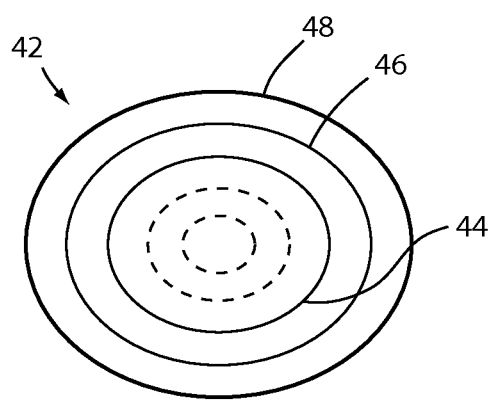
FIG. 2B illustrates the photoluminescent structure rendered as a discrete particle.
Figure 2C:
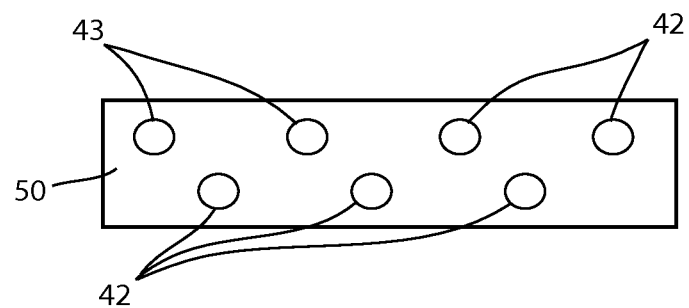
FIG. 2C illustrates a plurality of photoluminescent structures rendered as discrete particles and incorporated into a separate structure.

Referring to FIGS. 2A-2C, a photoluminescent structure 42 is generally shown rendered as a coating (e.g. a film) capable of being applied to a vehicle fixture, a discrete particle capable of being implanted in a vehicle fixture, and a plurality of discrete particles incorporated into a separate structure capable of being applied to a vehicle fixture, respectively. The photoluminescent structure 42 may correspond to the photoluminescent portions as discussed herein, for example the first photoluminescent portion 24 and the second photoluminescent portion 30. At the most basic level, the photoluminescent structure 42 includes an energy conversion layer 44 that may be provided as a single layer or a multilayer structure, as shown through broken lines in FIGS. 2A and 2B.

The energy conversion layer 44 may include one or more photoluminescent materials having energy converting elements selected from a phosphorescent or a fluorescent material. The photoluminescent materials may be formulated to convert an inputted electromagnetic radiation into an outputted electromagnetic radiation generally having a longer wavelength and expressing a color that is not characteristic of the inputted electromagnetic radiation. The difference in wavelength between the inputted and outputted electromagnetic radiations is referred to as the Stokes shift and serves as the principle driving mechanism for an energy conversion process corresponding to a change in wavelength of light, often referred to as down conversion. In the various implementations discussed herein, each of the wavelengths of light (e.g. the first wavelength, etc.) correspond to electromagnetic radiation utilized in the conversion process.

Each of the photoluminescent portions may comprise at least one photoluminescent structure 42 comprising an energy conversion layer (e.g. conversion layer 44). The energy conversion layer 44 may be prepared by dispersing the photoluminescent material in a polymer matrix 50 to form a homogenous mixture using a variety of methods. Such methods may include preparing the energy conversion layer 44 from a formulation in a liquid carrier medium and coating the energy conversion layer 44 to a desired planar and/or non-planar substrate of a vehicle fixture. The energy conversion layer 44 coating may be deposited on a vehicle fixture by painting, screen printing, spraying, slot coating, dip coating, roller coating, and bar coating. Additionally, the energy conversion layer 44 may be prepared by methods that do not use a liquid carrier medium.

For example, a solid state solution (homogenous mixture in a dry state) of one or more photoluminescent materials may be incorporated in a polymer matrix 50 to provide the energy conversion layer 44. The polymer matrix 50 may be formed by extrusion, injection molding, compression molding, calendaring, thermoforming, etc. In instances where one or more energy conversion layers 44 are rendered as particles, the single or multilayered energy conversion layers 44 may be implanted into a vehicle fixture or panel. When the energy conversion layer 44 includes a multilayer formulation, each layer may be sequentially coated. Additionally, the layers can be separately prepared and later laminated or embossed together to form an integral layer. The layers may also be co-extruded to prepare an integrated multilayered energy conversion structure.

Referring back to FIGS. 2A and 2B, the photoluminescent structure 42 may optionally include at least one stability layer 46 to protect the photoluminescent material contained within the energy conversion layer 44 from photolytic and thermal degradation. The stability layer 46 may be configured as a separate layer optically coupled and adhered to the energy conversion layer 44. The stability layer 46 may also be integrated with the energy conversion layer 44. The photoluminescent structure 42 may also optionally include a protective layer 48 optically coupled and adhered to the stability layer 46 or any layer or coating to protect the photoluminescent structure 42 from physical and chemical damage arising from environmental exposure.

The stability layer 46 and/or the protective layer 48 may be combined with the energy conversion layer 44 to form an integrated photoluminescent structure 42 through sequential coating or printing of each layer, or by sequential lamination or embossing. Alternatively, several layers may be combined by sequential coating, lamination, or embossing to form a substructure. The substructure may then be laminated or embossed to form the integrated photoluminescent structure 42. Once formed, the photoluminescent structure 42 may be applied to a chosen vehicle fixture and/or panel.

In some implementations, the photoluminescent structure 42 may be incorporated into a vehicle fixture as one or more discrete multilayered particles as shown in FIG. 2C. The photoluminescent structure 42 may also be provided as one or more discrete multilayered particles dispersed in a polymer formulation that is subsequently applied to a vehicle fixture or panel as a contiguous structure. Additional information regarding the construction of photoluminescent structures to be utilized in at least one photoluminescent portion of a vehicle is disclosed in U.S. Pat. No. 8,232,533 to Kingsley et al., entitled "PHOTOLYTICALLY AND ENVIRONMENTALLY STABLE MULTILAYER STRUCTURE FOR HIGH EFFICIENCY ELECTROMAGNETIC ENERGY CONVERSION AND SUSTAINED SECONDARY EMISSION," filed Jul. 31, 2012, the entire disclosure of which is incorporated herein by reference.

Figure 3:
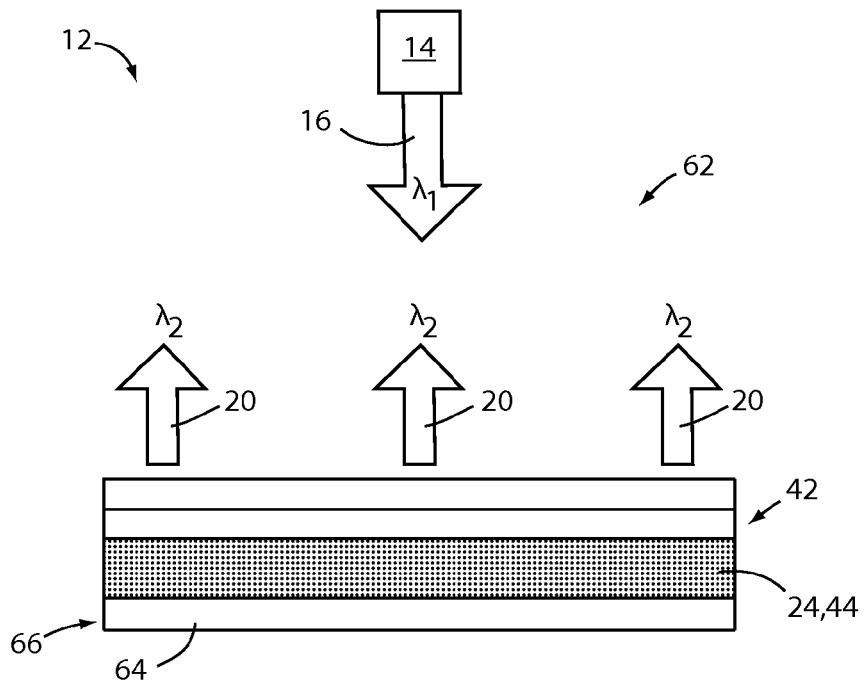
FIG. 3 illustrates a lighting system configured to convert a first emission of light to a second emission of light.

Referring to FIG. 3, the lighting system 12 is generally shown according to a front-lit configuration 62 to convert the first emission 16 from the at least one light source 14 to the second emission 20. The first emission 16 comprises a first wavelength $\lambda_1$, and the second emission 20 comprises a second wavelength $\lambda_2$. The lighting system 12 may include the photoluminescent structure 42 rendered as a coating and applied to a substrate 64 of a vehicle fixture 66. The photoluminescent structure 42 may include the energy conversion layer 44, and in some implementations may include the stability layer 46 and/or protective layer 48. In response to the at least one light source 14 being activated, the first emission 16 is converted from the first wavelength $\lambda_1$ to the second emission 20 having at least the second wavelength $\lambda_2$. The second emission 20 may comprise a plurality of wavelengths configured to emit significantly white light from the vehicle fixture 66.

In various implementations, the lighting system 12 comprises at least one energy conversion layer 44 configured to convert the first emission 16 at the first wavelength $\lambda_1$ to the second emission 20 having at least the second wavelength $\lambda_2$. The at least one energy conversion layer 44 may be configured to generate a variety of visible colors by utilizing at least one of a red-emitting photoluminescent material, a green-emitting photoluminescent material, and a blue-emitting photoluminescent material dispersed in the polymer matrix 50. The red, green, and blue-emitting photoluminescent materials may be combined to generate the significantly white light for the second emission 20. Further, the red, green, and blue-emitting photoluminescent materials may be utilized in a variety of proportions and combinations to control the color of the second emission 20.

Each of the photoluminescent materials may vary in output intensity, output wavelength, and peak absorption wavelengths based on a particular photochemical structure and combinations of photochemical structures utilized in the energy conversion layer 44. An intensity of the second emission 20 may be changed by adjusting the wavelength of the first emission. In addition to or in alternative to the red, green, and blue-emitting photoluminescent materials, other photoluminescent materials may be utilized alone and in various combinations to generate the second emission 20 in a wide variety of colors. In this way, the lighting system 12 may be configured for a variety of applications to provide a desired lighting color and effect for the vehicle 10.

The at least one light source 14, may refer to the plurality of light sources including the first light source 22 and the second light source 26. The at least one light source 14 may also be referred to as an excitation source and is operable to emit at least the first emission 16. The at least one light source 14 may comprise any form of light source, for example halogen lighting, fluorescent lighting, light emitting diodes (LEDs), organic LEDs (OLEDs), polymer LEDs (PLEDs), solid state lighting or any other form of lighting configured to output the first emission 16.

Figure 4:
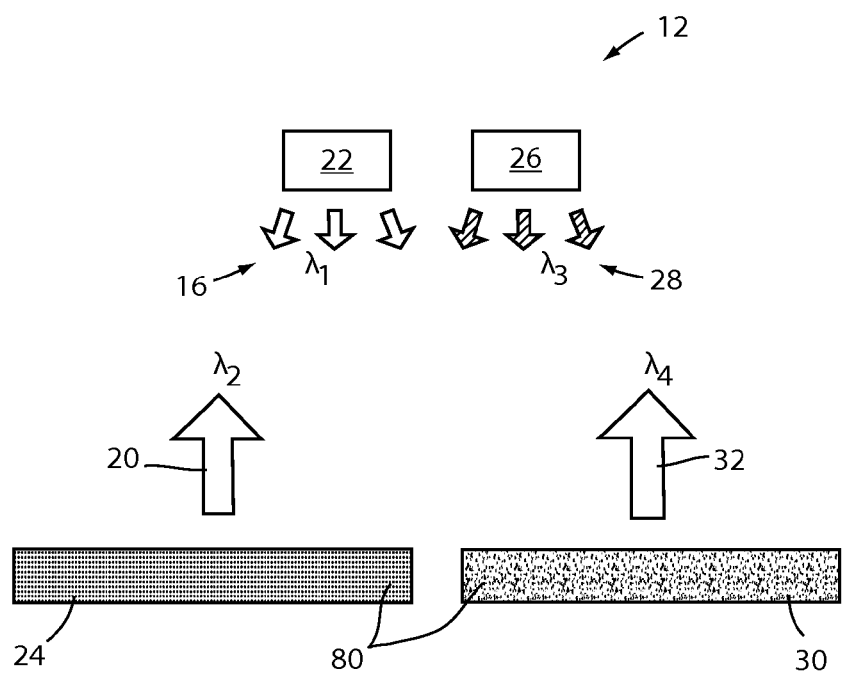
FIG. 4 illustrates the lighting system configured to convert first and second emissions of light into a third and fourth emission of light, respectively.

Referring now to FIG. 4, the lighting system 12 is shown in a configuration comprising a plurality of photoluminescent portions 80 including the first photoluminescent portion 24 and the second photoluminescent portion 30. The first photoluminescent portion 24 is configured to emit the second emission 20 in response receiving the first emission 16 from the first light source 22. The second photoluminescent portion 30 is configured to emit the fourth emission 32 in response receiving the third emission 28 from the second light source 26. Each of the plurality of photoluminescent portions 80 may be excited independently. For example, the second emission 20 may be output while the fourth emission 32 is inactive, and the fourth emission 32 may be output while the second emission 20 is inactive. This selective activation of each of the photoluminescent portions 80 may be implemented by utilizing photoluminescent materials having non-overlapping absorption ranges.

In some implementations, the first emission 16 from the first light source 22 may be configured such that the first wavelength $\lambda_1$ corresponds to a first absorption range of the first photoluminescent portion 24. The third emission 28 from the second light source 26 may be configured such that the third wavelength $\lambda_3$ corresponds to a second absorption range of the second photoluminescent portion 30. The first absorption range may correspond to a light emission absorption range that is substantially different than the second absorption range. In this configuration, the first light source 22 may selectively activate the first photoluminescent portion 24 with the first emission 16 in the first absorption range and the second light source 26 may selectively activate the second photoluminescent portion 30 with the third emission 28 in the second absorption range.

Figure 5:
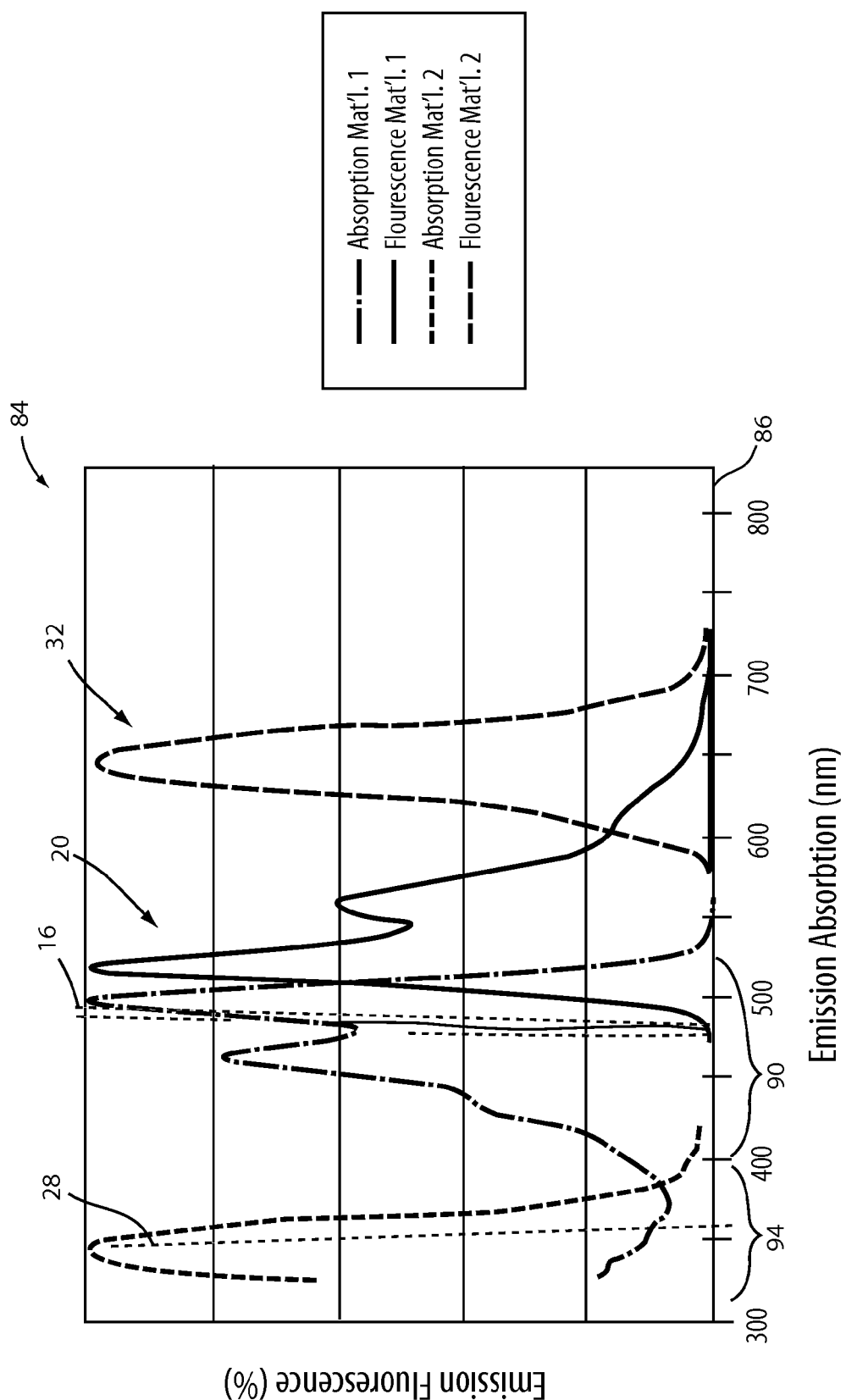
FIG. 5 is a graphical representation demonstrating a plurality of Stoke shifts corresponding to a conversion of a first and second emission of light to a third and fourth emission of light.

Referring now to FIG. 5, an exemplary graphical representation 84 of the conversion of the first emission 16 to the second emission 20 and the third emission 28 to the fourth emission 32 is shown. The independent axis 86 of the graph 84 demonstrates an absorption range in nanometers which corresponds to the wavelengths of light absorbed by the photoluminescent materials and corresponding photoluminescent portions 24 and 30. The dependent axis 88 demonstrates the emission fluorescence percentage of the photoluminescent ranges as a function of the emission absorption. Each of the emissions 20 and 32 from the photoluminescent portions 24 and 30 are configured to output light at one or more wavelengths corresponding to the specific photoluminescent materials implemented.

In this example, the graphical representation 84 demonstrates the first absorption range 90 and the second absorption range 92 and each of the corresponding light emissions (e.g. the second emission 20 and the fourth emission 32). The first absorption range 90 corresponds to longer wavelengths of light than the second absorption range 92. In this way, the first photoluminescent portion 24 may be illuminated independent of the second photoluminescent portion 30. The absorption ranges and resulting emissions may be configured by the particular photoluminescent materials utilized in each of the photoluminescent portions 24 and 30. Various combinations of photoluminescent materials may provide for a wide range of colors and combinations of wavelengths to generate the motion effect.

The term absorption range as used herein defines a range of wavelengths that excite a photoluminescent portion or structure and cause a photoluminescent material to become excited. In response to the excitation, the photoluminescent portion emits an emission having at least one wavelength of light which is at least partially outside the absorption range. In various implementations, the absorption range of the photoluminescent materials as discussed herein may vary. Additionally, the emission of light in the form of emitted fluorescence may be selected based on the material properties of the photoluminescent structures discussed herein.

Referring now to FIGS. 4 and 5, an example of a particular combination of photoluminescent materials and light sources is demonstrated. The first absorption range 90 may correspond to a range of wavelengths in blue and/or near UV range of light having wavelengths of approximately 390-450 nm. The second absorption range 92 may correspond to a substantially non-overlapping range of wavelengths in the UV and/or blue range of light having wavelengths of approximately 250-410 nm. The first emission 16 may be approximately 470 nm configured to cause the first photoluminescent portion 24 to output the second emission 20 of approximately 525 nm. The third emission 28 may be approximately 370 nm configured to cause the second photoluminescent portion 30 to output the fourth emission 32 of approximately 645 nm. In this way, the second emission 20 and the fourth emission 32 may be selectively excited by each of the light sources 22, 26 to independently output a substantially green colored light and a substantially orange-red colored light, respectively.

In general, the photoluminescent materials of the first photoluminescent portion 24 and the second photoluminescent portion 30 may be combined in various proportions, types, layers, etc. to generate a variety of colors for the each of the luminescent emissions. Though particular materials and structures of photoluminescent materials are discussed herein, various materials may be utilized without departing from the spirit of the disclosure. In some implementations, the first photoluminescent portion 24 is configured to have the first absorption range 90 being substantially greater than the second absorption range 92. Additionally, the second wavelength $\lambda_2$ of the second emission 20 may be configured to output a substantially shorter wavelength or range of wavelengths than the fourth wavelength $\lambda_4$ of the fourth emission 32.

In some implementations, the first photoluminescent portion 24 may comprise an organic fluorescent dye configured to convert the first emission 16 to the second emission 20. For example, the first photoluminescent material may comprise a photoluminescent structure of rylenes, xanthenes, porphyrins, phthalocyanines, or other materials suited to a particular Stoke shift defined by an absorption range and emission fluorescence. The first photoluminescent portion 24 and corresponding material may be configured to have a shorter Stoke shift than the second photoluminescent portion. In this way, each of the photoluminescent portions 24 and 30 may be independently illuminated by the light sources 22 and 26 to output different colors of light.

The second photoluminescent portion 30 may comprise a photoluminescent structure 42 configured to generate a longer stoke shift than the first photoluminescent portion 24. The second photoluminescent portion may comprise an organic or inorganic material configured to have the second absorption range 92 and a desired output wavelength or color. In an exemplary embodiment, the photoluminescent structure 42 of the second photoluminescent portion 30 may be of at least one inorganic luminescent material selected from the group of phosphors. The inorganic luminescent material may more particularly be from the group of Ce-doped garnets, such as YAG:Ce. This configuration may provide for a second stoke shift of the second photoluminescent portion 30 to be longer than a first stoke shift of the first photoluminescent portion 24.

The first emission 16 and the third emission 28 from the light sources are shown having wavelengths in the blue spectral color range and shorter wavelengths (UV wavelengths). Such wavelengths may be utilized as excitation sources for the photoluminescent portions and provide nearly imperceptible lighting sources due to these wavelengths having limited perceptual acuity in the visible spectrum of the human eye. By utilizing shorter wavelengths for the excitation sources (e.g. the first emission 16 and the third emission 28) the lighting system 12 may create a visual effect of light originating from the photoluminescent portions 24 and 30. Further, in this configuration, light is emitted from the photoluminescent structure 42 (e.g. the first photoluminescent portion 24, the second photoluminescent portion 30) from locations of the vehicle 10 that may be inaccessible or costly to add conventional light sources requiring electrical connections.

To achieve the various colors and combinations of photoluminescent materials described herein, the lighting system 12 may utilize any form of photoluminescent materials, for example phospholuminescent materials, organic and inorganic dyes, etc. For additional information regarding fabrication and utilization of photoluminescent materials to achieve various emissions, refer to U.S. Pat. No. 8,207,511 to Bortz et al., entitled "PHOTOLUMINESCENT FIBERS, COMPOSITIONS AND FABRICS MADE THEREFROM," filed Jun. 26, 2012; U.S. Pat. No. 8,247,761 to Agrawal et al., entitled "PHOTOLUMINESCENT MARKINGS WITH FUNCTIONAL OVERLAYERS," filed Aug. 21, 2012; U.S. Pat. No. 8,519,359 B2 to Kingsley et al., entitled "PHOTOLYTICALLY AND ENVIRONMENTALLY STABLE MULTILAYER STRUCTURE FOR HIGH EFFICIENCY ELECTROMAGNETIC ENERGY CONVERSION AND SUSTAINED SECONDARY EMISSION," filed Aug. 27, 2013; U.S. Pat. No. 8,664,624 B2 to Kingsley et al., entitled "ILLUMINATION DELIVERY SYSTEM FOR GENERATING SUSTAINED SECONDARY EMISSION," filed Mar. 4, 2014; U.S. Patent Publication No. 2012/0183677 to Agrawal et al., entitled "PHOTOLUMINESCENT COMPOSITIONS, METHODS OF MANUFACTURE AND NOVEL USES," filed Jul. 19, 2012; U.S. Patent Publication No. 2014/0065442 A1 to Kingsley et al., entitled "PHOTOLUMINESCENT OBJECTS," filed Mar. 6, 2014; and U.S. Patent Publication No. 2014/0103258 A1 to Agrawal et al., entitled "CHROMIC LUMINESCENT COMPOSITIONS AND TEXTILES," filed Apr. 17, 2014, all of which are incorporated herein by reference in their entirety.

Figure 6A:
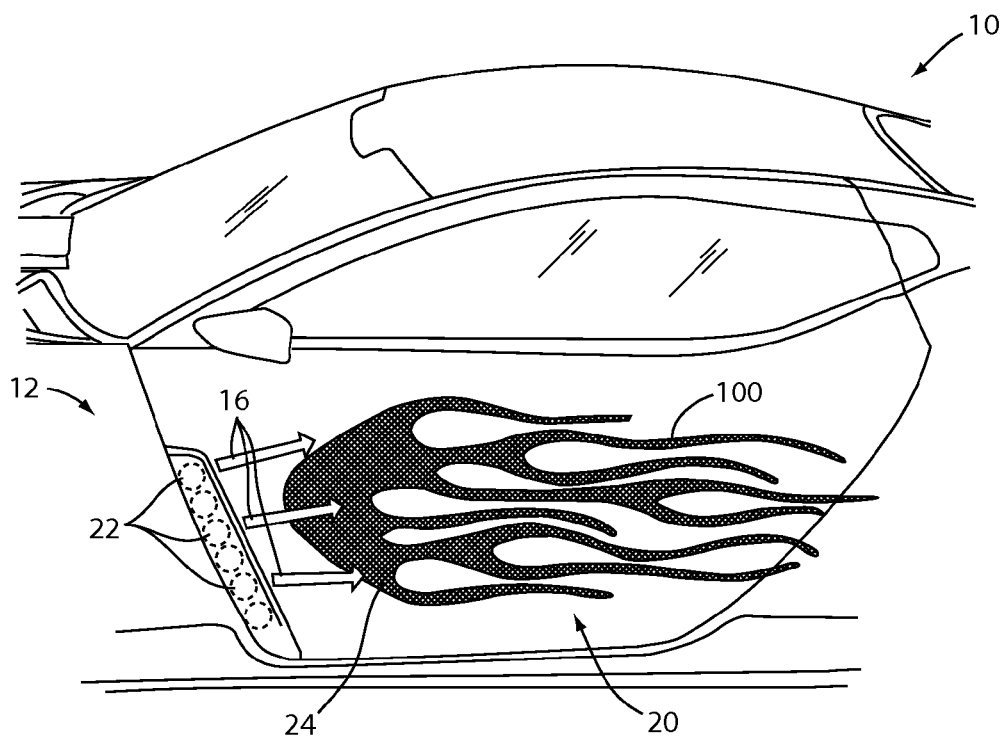
FIG. 6A is a detailed view of a first emission of light configured to illuminate a first photoluminescent portion of a vehicle.
Figure 6B:
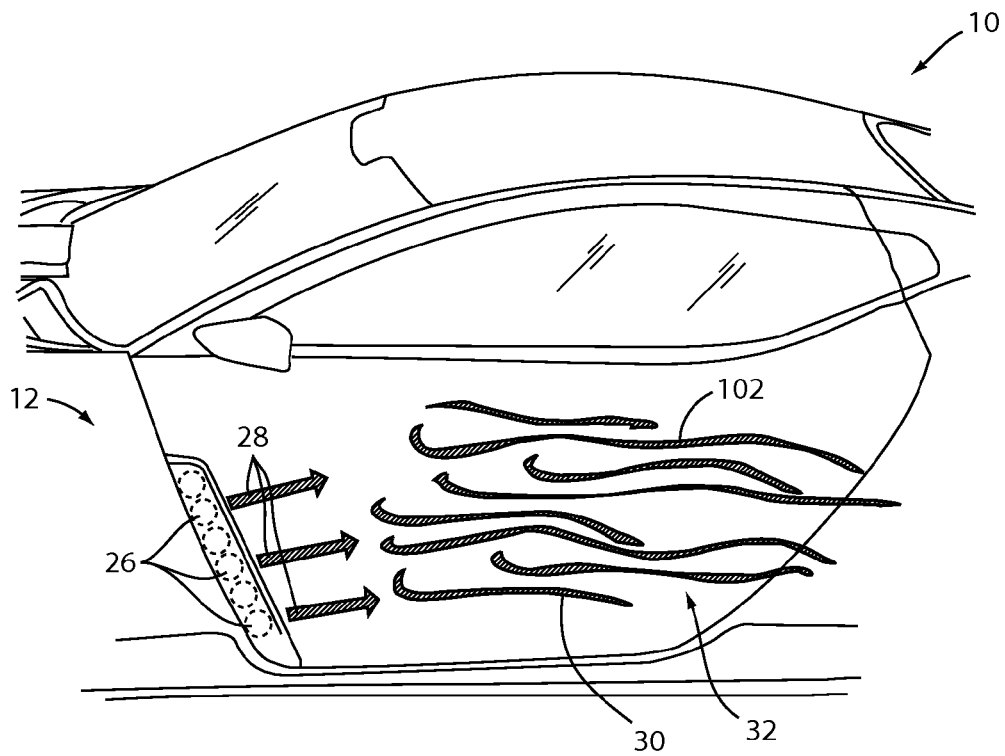
FIG. 6B is a detailed view of a second emission of light configured to illuminate a second photoluminescent portion of a vehicle.
Figure 6C:
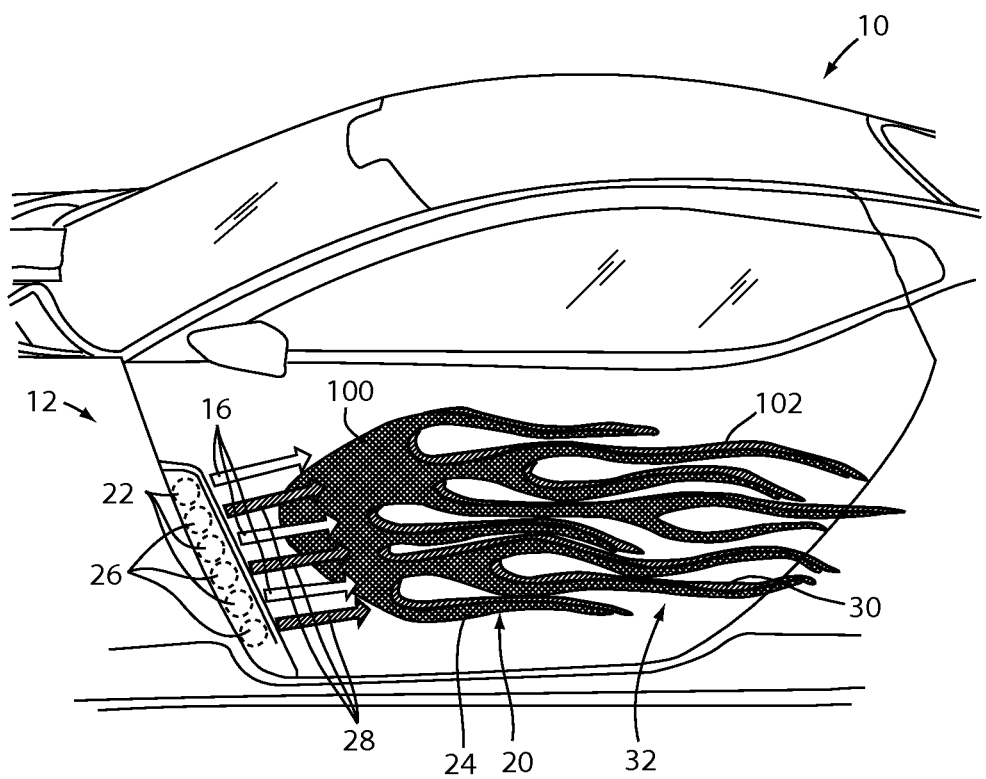
FIG. 6C is a detailed view of a first and second emission of light configured to illuminate first and second photoluminescent portions of a vehicle.

Referring now to FIGS. 6A-6C, detailed views of the first photoluminescent portion 24 and the second photoluminescent portion 30 are shown demonstrating a motion effect and/or combined accent lighting in accordance with the disclosure. As discussed herein, the lighting system 12 is operable to selectively illuminate the first photoluminescent portion 24 by emitting the first emission 16 from the first light source 22. The lighting system 12 is further operable to selectively illuminate the second photoluminescent portion 30 by emitting the third emission 28 from the second light source 26. Each of the light sources 22 and 26 may be selectively activated by one or more lighting controllers configured to control the first and second light sources 22 and 26.

The light sources 22 and 26 may be activated in combination or intermittently to generate a visual effect, for example a flickering, wavering, animated movement, etc. When activated in combination, as shown in FIG. 6C, combination of the second emission 20 and the fourth emission 32 provide for the simultaneous output of a first color 100 of light corresponding to the second wavelength $\lambda_2$ and the second color 102 of light corresponding to the fourth wavelength $\lambda_4$. As demonstrated in FIG. 5, the second wavelength $\lambda_2$ and the fourth wavelength $\lambda_4$ may each correspond to one or more wavelengths combined to form an average or perceived color of light. Each of the first color 100 and the second color 102 may correspond to different perceived colors or hues of colors that may be selectively output to generate a motion effect.

Figure 7A:
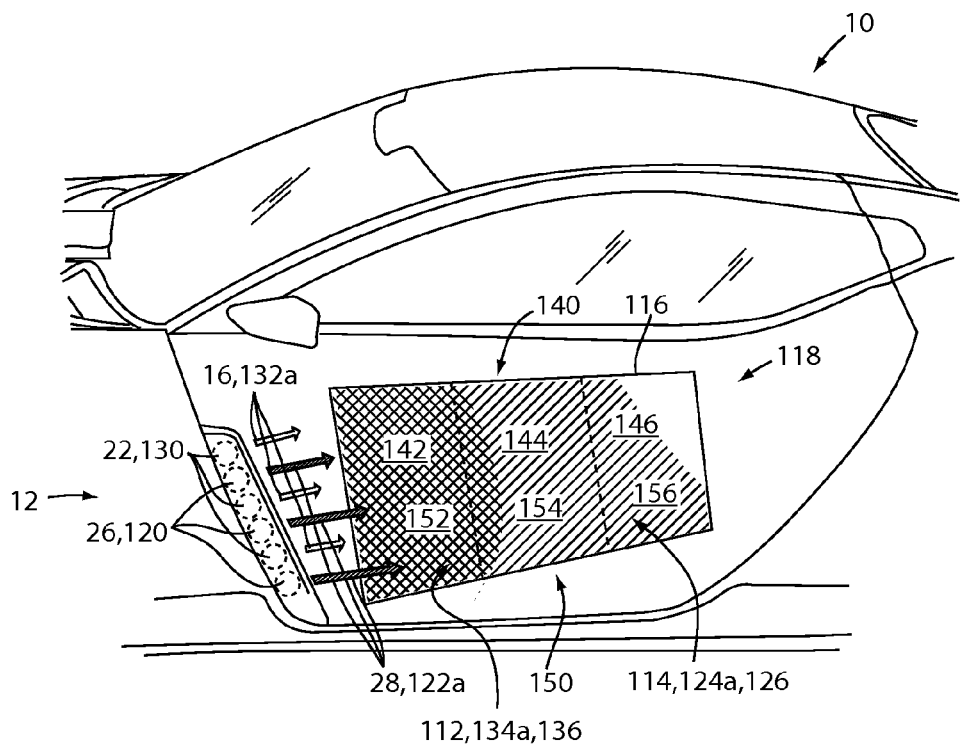
FIG. 7A is a detailed view of a first photoluminescent portion and a second photoluminescent portion configured to illuminate a surface of a vehicle.
Figure 7B:
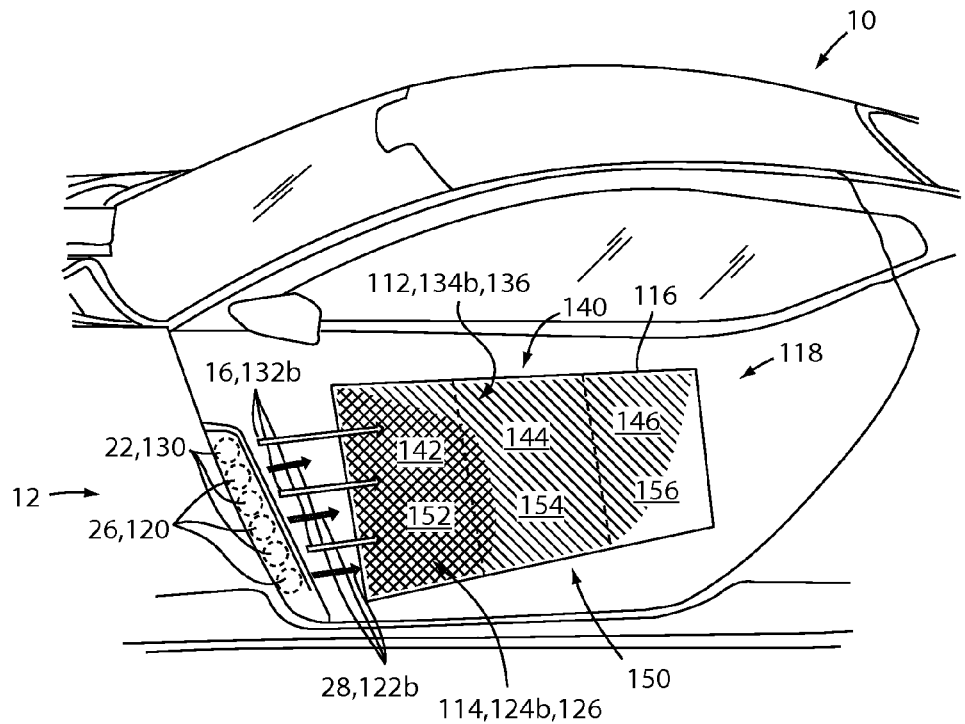
FIG. 7B is a detailed view of a first photoluminescent portion and a second photoluminescent portion configured to illuminate a surface of a vehicle

Referring now to FIGS. 7A and 7B, detailed views of a first photoluminescent portion 112 and a second photoluminescent portion 114 are shown demonstrating a fading or moving lighting effect which may be configured to generate a plurality of colors of light. In this example, each of the photoluminescent portions 112 and 114 may be similar to the first photoluminescent portion 24 and the second photoluminescent portion 30 in that the first photoluminescent portion is primarily illuminated in response to the first emission 16 from the first light source 22 and the second photoluminescent portion is primarily illuminated in response to the third emission 28 from the second light source 26. In this configuration, the first light source 22 and the second light source 26 may be configured to generate a moving, fading, and/or pulsing lighting effect by controlling the intensity and directional focus of the first light source 22 and the second light source 26.

Each of the photoluminescent portions 112 and 114 as shown form a selectively illuminated portion 116 that may correspond to a coating applied to a surface 118 of the vehicle 10 and/or at least one photoluminescent material dispersed in a paint or coating applied to the surface 118. For clarity, the selectively illuminated portion 116 is shown as a simple trapezoidal shape, however, the selectively illuminated portion 116 may correspond to any shape, design, accent, and/or combination thereof. Further, the first photoluminescent portion 112 may correspond to a first shape or design, and the second photoluminescent portion 114 may correspond to a second shape or design each having different extents and/or proportions. The first photoluminescent portion 112 may also partially or completely overlap the second photoluminescent portion 114 within the selectively illuminated portion 116.

As demonstrated in FIGS. 7A and 7B, the first photoluminescent portion 112 is demonstrated as a first pattern of lines extending downward diagonally from the upper left boundary of the selectively illuminated portion 116 to the lower right boundary of the selectively illuminated portion 116. The second photoluminescent portion 114 is demonstrated as a second pattern of lines extending upward diagonally from the lower left boundary of the selectively illuminated portion 116 to the upper right boundary of the selectively illuminated portion 116. For clarity, each of the photoluminescent portions 112 and 114 is demonstrated as extending coextensive to the boundaries of the selectively illuminated portion 116. However, each of the photoluminescent portions may be applied to any portion of the surface 118 or any other surface of the vehicle 10 where the light sources 22 and 26 may be directed.

Referring to FIG. 7A, the second light source 26 is shown as a second plurality of lighting devices 120. The lighting system 12 is operable to generate a second gradient of light or pattern 122a of light emitted as the third emission 28, as demonstrated by the length of each of the arrows denoting the third emission 28. Corresponding to the pattern 122a of light, an illuminated area 124a of the second photoluminescent portion 114 may be excited to emit a fourth emission 126. The first light source 22 comprises a first plurality of lighting devices 130 and is also operable to generate a first gradient of light or pattern 132a of light emitted as the first emission 16, as demonstrated by the length of each of the arrows denoting the first emission 16. Corresponding to the pattern 132a of light, an illuminated area 134a of the first photoluminescent portion 112 is excited to emit a second emission 136. In this configuration, each of the light sources 22 and 26, and their respective lighting devices 130 and 120 are operable to selectively illuminate various patterns and portions of each of the photoluminescent portions 112 and 114.

Referring to FIG. 7B, as a further example, the lighting system 12 is operable to generate a first gradient of light or pattern 132b of light emitted as the first emission 16, as demonstrated by the length of each of the arrows denoting the first emission 16. Corresponding to the pattern 132b of light, an illuminated area 134b of the first photoluminescent portion 112 is excited to emit the second emission 136. The second light source 26 comprises the second plurality of lighting devices 120 and is also operable to generate the second gradient of light or pattern 122b of light emitted as the third emission 28. Corresponding to the pattern 122b of light, an illuminated area 124b of the second photoluminescent portion 114 is excited to emit the fourth emission 126.

The various lighting emissions and corresponding patterns, emitted from the first plurality of lighting devices 130 and the second plurality of lighting device 120, may be configured to illuminate different extents, portions and patterns of photoluminescent emissions from the surface 118. The photoluminescent emissions are selectively generated by each of the lighting devices 130 and 120 by exciting the photoluminescent materials of the first photoluminescent portion 112 and the second photoluminescent portion 114. The various patterns of light emitted from the photoluminescent portions 130 and 120 may be controlled by the lighting intensity and selective illumination of each lighting device of the lighting devices 130 and 120. In this configuration, the lighting system 12 is operable to generate various patterns of light and lighting effects on the surface 118 of the vehicle 10. In some implementations, the lighting system 12 is operable to generate fading, moving, pulsing, and various additional lighting patterns by selectively activating the second emission 136 and the fourth emission 126 in response to the activation of the first plurality of lighting devices 130 and the second plurality of lighting device 120.

As discussed herein, the first photoluminescent portion 112 and the second photoluminescent portion 114 may correspond to a first color and a second color respectively. Each of the photoluminescent portions 112 and 114 may also be configured to have a first absorption range 90 and a second absorption range 92 as discussed in reference to FIG. 5. In general, the first absorption range and the second absorption range may correspond to substantially different ranges or partially overlapping ranges of wavelengths of light emitted from the first light source 22 and the second light source 26. In the example wherein the first and second absorption ranges correspond to substantially different wavelengths of light, the first photoluminescent portion 112 and the second photoluminescent portion 124 may be excited independently by their respective light sources 22 and 26. In the example wherein the first absorption range and the second absorption range are partially overlapping, the first photoluminescent portion 112 and the second photoluminescent portion 124 may be excited partially by each of the light sources 22 and 26 to vary the intensity and generate a blending effect of the first photoluminescent portion 112 and the second photoluminescent portion 114.

For example, the first light source 22 may illuminate the first photoluminescent portion 112 with an efficiency of approximately 90 percent and also illuminate the second photoluminescent 114 portion with an efficiency of approximately 40 percent. The efficiency of each of the light sources 22 and 26 to illuminate the photoluminescent portions 112 and 114 may be controlled by selecting light sources that emit desired wavelengths of light. The desired wavelengths of light may correspond to different portions of an absorption range of a particular photoluminescent material or combination of photoluminescent materials. In this configuration, the first light source 22 may be operable to blend the first color emitted from the first photoluminescent portion 112 with the second color emitted from the second photoluminescent portion 114. Similarly, the second light source 26 may be operable to blend the second color emitted from the second photoluminescent portion 114 with the first color emitted from the first photoluminescent portion 112. By varying the intensities from each lighting device of the plurality of lighting devices 130 and 120, the light system is operable to generate variety of colors of light, patterns of light, motion effects, and combinations thereof.

In some implementations, the first photoluminescent portion 112 may further be configured to emit a plurality of colors of light from a first plurality of colored portions 140. For example, the first photoluminescent portion 112 may comprise a first colored portion 142, a second colored portion 144, and a third colored portion 146. Each of the colored portions 142, 144, 146 may be configured to be excited with various levels of efficiency in response to the first emission 16 from the first light source 22. Further, the second photoluminescent portion 114 may be configured to emit a plurality of colors of light from a second plurality of colored portions 150. The second photoluminescent portion 114 may comprise a fourth colored portion 152, a fifth colored portion 154, and a sixth colored portion 156. Each of the colored portions 152, 154, 156 may be configured to be excited with various levels of efficiency in response to the second emission 28 from the second light source 26.

Though the colored portions 142, 144, 146, 152, 154, and 156 are demonstrated as overlapping portions of the first photoluminescent portion 112 and the second photoluminescent portion 114, each of the colored portions may be applied to distinct and/or partially overlapping portions of the surface 118. In this way, the lighting system 12 provides for the illumination of various patterns, colors, designs, lighting effects, and motion effects. The lighting system 12 is operable to control the intensity of each colored portion 142, 144, 146, 152, 154, and 156 at various levels and intensities by controlling each lighting device of the pluralities of lighting devices 130, 120. As demonstrated by the various examples and configurations described herein, the lighting system provides for a flexible lighting system operable to provide a variety of lighting effects. The lighting system 12 also has the additional benefit of being operable to generate various lighting effects while maintaining a low cost of implementation.

Referring now to FIGS. 8A, 8B, 8C, and 8D, a lighting system 178 may be configured to illuminate a surface 180 of a vehicle 182. The lighting system 178 may embody various features and elements discussed in reference to the lighting system 12. As such, like reference numerals may be utilized to describe various elements of the lighting system 178. The lighting system 178 may be configured to illuminate a first graphic 184 and a second graphic 186. Each of the first graphic 184 and the second graphic 186 may be configured to selectively illuminate in response to receiving an emission from at least one light source 188. The lighting system 178 may also be configured to interact with environmental lighting conditions (daytime, nighttime, artificial lighting, etc.) to provide various visual effects displayed by selectively illuminating the first graphic 184 and the second graphic 186.

The term, graphic, as used herein may refer to any form of character, logo, marking, shape, and any other form of design. As such, each of the first graphic, the second graphic, and any other graphics, design, logos, and/or characters may be interchanged, combined, and/or blended to achieve a desired appearance for the first graphic 184 and the second graphic 186. For example, the first graphic 184 is shown as a logo or group of characters, and the second graphic is shown as a shape. However, in various implementations, the first graphic 184 and the second graphic 186 may correspond to any combination of characters, designs, logos, shapes, and/or markings disposed on a surface of a vehicle.

The at least one light source 188 may be disposed on the surface 180 of the vehicle 182, and in some implementations, may be concealed behind a panel or trim strip 190. In this configuration, the lighting system 12 may be operable to project light from the at least one light source 188 which may result in the first graphic 184 and the second graphic 186 becoming illuminated. In some implementations, the at least one light source 188 may comprise the first light source 22 and the second light source 26. The first light source 22 and the second light source 26 may each be configured in an array of emitters extending longitudinally along the surface 180 of the vehicle 182. Similar to the lighting system 12, the first light source 22 may be configured to emit a first emission 16, and the second light source 26 may be configured to emit a third emission 28. For clarity, the first light source 22 is only indicated by reference numeral 22 in FIGS. 8B and 9, and the second light source 26 is only indicated by reference numeral 26 in FIGS. 8C and 9. Corresponding reference numerals for the first emission 16 and the second emission 28 may also be indicated in FIGS. 8B and 9, and FIGS. 8C and 9, respectively.

Figure 8A:
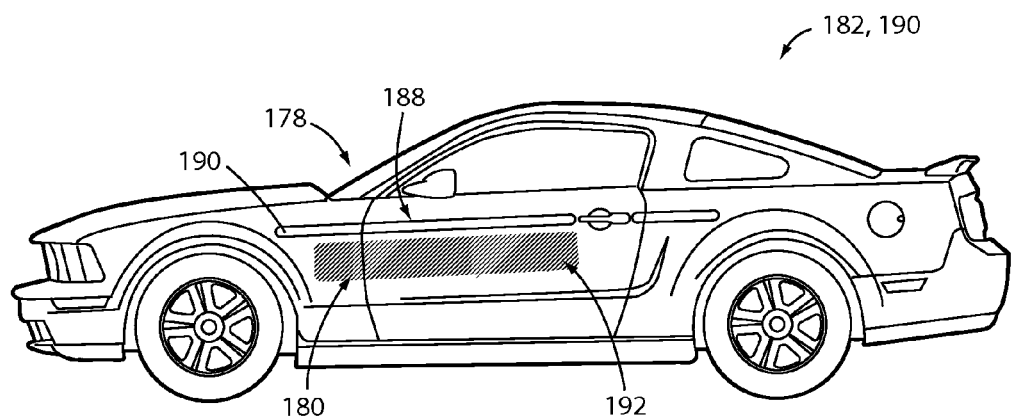
FIG. 8A is a side view of a vehicle comprising a lighting system operable to illuminate a surface of the vehicle from a concealed light source.

FIG. 8A demonstrates the lighting system 178 in a first state 190 corresponding to the first light source 22 and the second light source 26 being inactive. As illustrated, FIG. 8A may demonstrate the appearance of the surface 180 in a daytime or nighttime lighting condition. The surface 180 of the vehicle 182 is shown having a modeled or textured appearance in the form of a mask 192 corresponding to a region that may be illuminated by the at least one light source 188. The surface 180 may also correspond to a region of the vehicle 182 wherein the first graphic 184 and the second graphic 186 may be incorporated. In some implementations, the surface 180 may be painted and/or coated in an enamel and/or paint configured to provide the textured appearance 192.

In some implementations, the mask 192 may serve to diminish and conceal emissions of light corresponding to the first graphic 184 and the second graphic 186 resulting from environmental lighting conditions. For example, the first graphic 184 and the second graphic 186 may comprise at least one photoluminescent material that may become excited in response to receiving at least one wavelength of light from an environmental lighting source, for example the sun. As a result, the first graphic 184 and the second graphic 186 may be at least partially visible when the first light source 22 and the second light source 26 are inactive. By applying the mask 192 to the surface 180, the first graphic 184 and the second graphic 186 may be substantially hidden even when exposed to environmental lighting conditions. In such implementations, the first light source 22 and the second light source 26 may correspond to high power light sources, for example high power LEDs, operable to emit sufficient light energy to illuminate the first graphic 184 and/or the second graphic 186 when the vehicle 182 is exposed to environmental lighting conditions.

In some implementations, the mask 192 incorporating the modeled or textured appearance may be applied to the entirety of the vehicle 182 to provide a substantially uniform painted appearance. Similarly, the paint of the vehicle 182 may be textured similar to the mask 192. The mask 192 may also be configured to appear as a paint accent, for example a racing stripe. In this way, the first graphic 184 and the second graphic 186 may be concealed in a variety of ways when the surface 180 is exposed to environmental lighting conditions.

Though the mask 192 is described as being utilized to diminish and/or conceal the first graphic 184 and the second graphic 186 when exposed to environmental lighting conditions, in some implementations, the mask 192 may not be utilized. The luminance of the first graphic 184 and the second graphic 186 in response to environmental lighting conditions may be highly dependent on a combination of a color of paint of the vehicle 182, a concentration and/or intensity of a photoluminescent material utilized in the graphics 184 and 186, and one or more colors emitted by photoluminescent materials utilized in the graphics 184 and 186. For example, sunlight may cause each of the first graphic 184 and the second graphic 186 to illuminate by supplying an excitation emission similar to the first and/or third emissions 16 and 28. However, if the concentration and/or intensity of photoluminescent materials utilized to generate emissions from the first graphic 184 and the second graphic 186 is limited, the broad-spectrum of the sunlight may partially or completely washout and/or hide any substantially visible evidence that the first graphic 184 and the second graphic 186 are illuminated. As such, the mask 192 may be utilized in some implementations and may not be desirable in others.

Figure 8B:
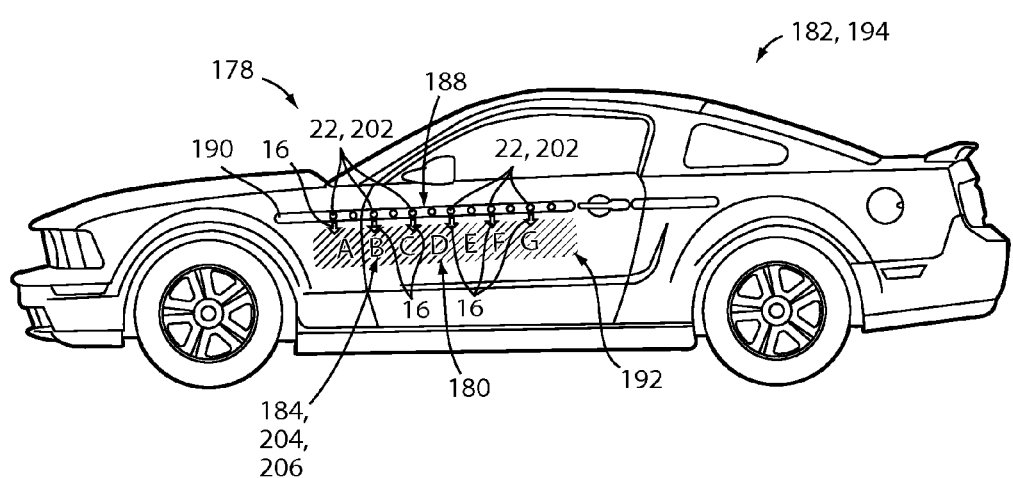
FIG. 8B is a side view of a vehicle comprising a lighting system demonstrating a first photoluminescent graphic illuminated by a first light source.
Figure 8C:
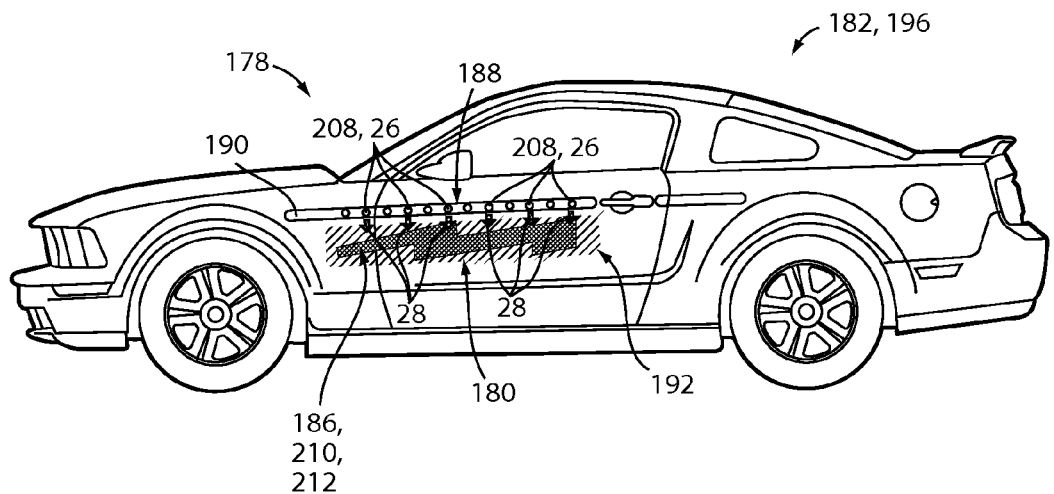
FIG. 8C is a side view of a vehicle comprising a lighting system demonstrating a second photoluminescent graphic illuminated by a second light source.
Figure 8D:
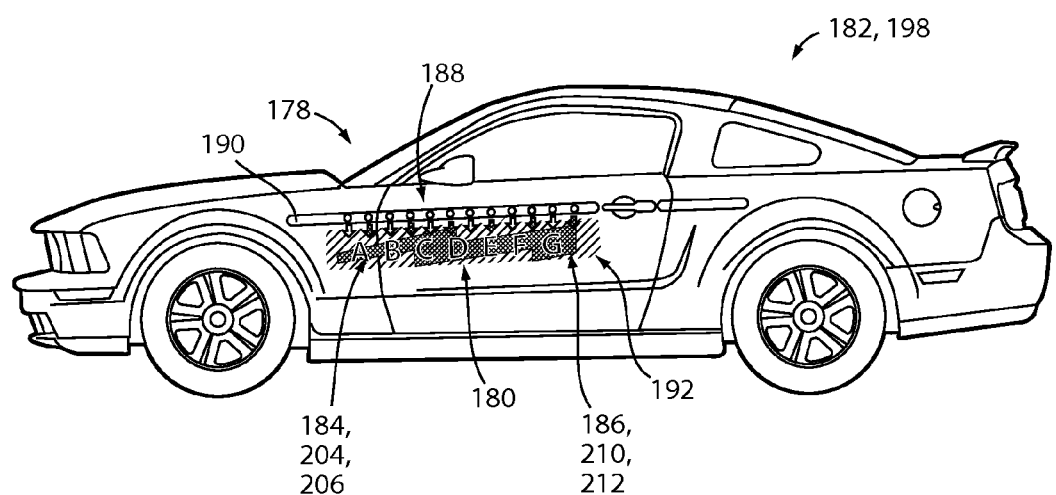
FIG. 8D is a side view of a vehicle comprising a lighting system demonstrating a plurality of photoluminescent graphics illuminated by at least one light source.

Referring now to FIGS. 8B, 8C, and 8D, the lighting system 178 is illustrated in a second state 194, a third state 196, and a fourth state 198, respectively. A resulting exemplary appearance of the surface 180 as demonstrated in FIGS. 8B, 8C, and 8D may correspond to an environmental lighting condition that does not include the first wavelength and the third wavelength corresponding to the first emission 16 and the third emission 28. That is, the lighting condition may not correspond to one or more excitation emissions configured to excite the photoluminescent materials corresponding to the first graphic 184 and the second graphic 186. For example, the environmental lighting condition may correspond to a nighttime lighting condition or an artificial lighting condition, such as a lighting condition of a vehicle showroom.

Additionally, FIGS. 8B, 8C, and 8D depict the mask 192 in a less apparent and lighter texture. This depiction of the mask 192 may provide an exemplary illustration of an embodiment of the lighting system 178 wherein the mask 192 is employed. The less apparent and lighter texture of the mask 192 may serve to demonstrate that during artificial and nighttime lighting conditions, a contrast between the mask 192 and other surfaces of the vehicle 182 may be less apparent. It may also be reiterated at this point that the mask 192 may not be incorporated in some implementations of the lighting system 178 and/or blended to match the appearance of the other surfaces of the vehicle 182.

FIG. 8B demonstrates the lighting system 178 having the first light source 22 activated such that the first emission 16 is emitted toward the surface 180 from a corresponding first array of emitters 202. The second light source 26 may be inactive in this configuration. In response receiving the first emission 16, a first photoluminescent portion 204 corresponding to the first graphic 184 may become excited and emit a second emission 206. In this configuration, the first photoluminescent portion 204 of the first graphic 184 may be illuminated to a substantially higher level of illumination or brightness than the second graphic 186. The higher level of illumination of the first graphic 184 relative to the second graphic 186 in response receiving the first emission 16 may be due to the first photoluminescent portion 204 having the first absorption range 90.

Referring to FIG. 8C, the lighting system 178 is shown having the second light source 26 activated such that the third emission 28 is emitted toward the surface 180 from a corresponding second array of emitters 208. The first light source 22 may be inactive in this configuration. In response to receiving the third emission 28, a second photoluminescent portion 210 corresponding to the second graphic 186 may become excited and emit a fourth emission 212. In response to receiving the third emission 28, the second photoluminescent portion 210 of the second graphic 186 may be illuminated to as a substantially higher level of illumination than the first graphic 184. As such, the lighting system 178 may be operable to selectively illuminate the first photoluminescent portion 204 substantially independent of the second photoluminescent portion 210.

As discussed herein, the first photoluminescent portion 204 and the second photoluminescent portion 210 may correspond to a first color and a second color respectively. Each of the photoluminescent portions 204 and 210 may also be configured to have the first absorption range 90 and the second absorption range 92, as discussed in reference to FIG. 5. In general, the first absorption range and the second absorption range may correspond to substantially different ranges or partially overlapping ranges of wavelengths of light emitted from the first light source 22 and the second light source 26, respectively. In the example wherein the first and second absorption ranges correspond to substantially different wavelengths of light, the first photoluminescent portion 204 and the second photoluminescent portion 210 may be excited independently by their respective light sources 22 and 26.

In the example wherein the first absorption range and the second absorption range are partially overlapping, the first photoluminescent portion 204 and the second photoluminescent portion 210 may be excited partially by each of the light sources 22 and 26. For example, the first wavelength of the first emission 16 may cause the second photoluminescent portion 210 to become illuminated at a lower intensity or brightness than the third wavelength of the third emission 28. Similarly, the third wavelength of the third emission 28 may cause the first photoluminescent portion 204 to become illuminated at a lower intensity or brightness than the first wavelength of the first emission 16. In this configuration, each of the light sources 22 and 26 may be configured to partially illuminate each of the photoluminescent portions 204 and 210 at different intensities to illuminate each of the graphics 184 and 186 in various combinations.

Referring to FIG. 8D, the lighting system 178 is shown having both the first and second lighting sources 22 and 26 activated. In this configuration, both the first emission 16 and the third emission 28 may be emitted toward the surface 180. In response to receiving these excitation emissions 16 and 28, both of the photoluminescent portions 204 and 210 may become excited and emit the second emission 206 and the fourth emission 212, respectively. In this way, the lighting system 178 may be operable to selectively illuminate both the first photoluminescent portion 204 and the second photoluminescent portion 210.

Figure 9:
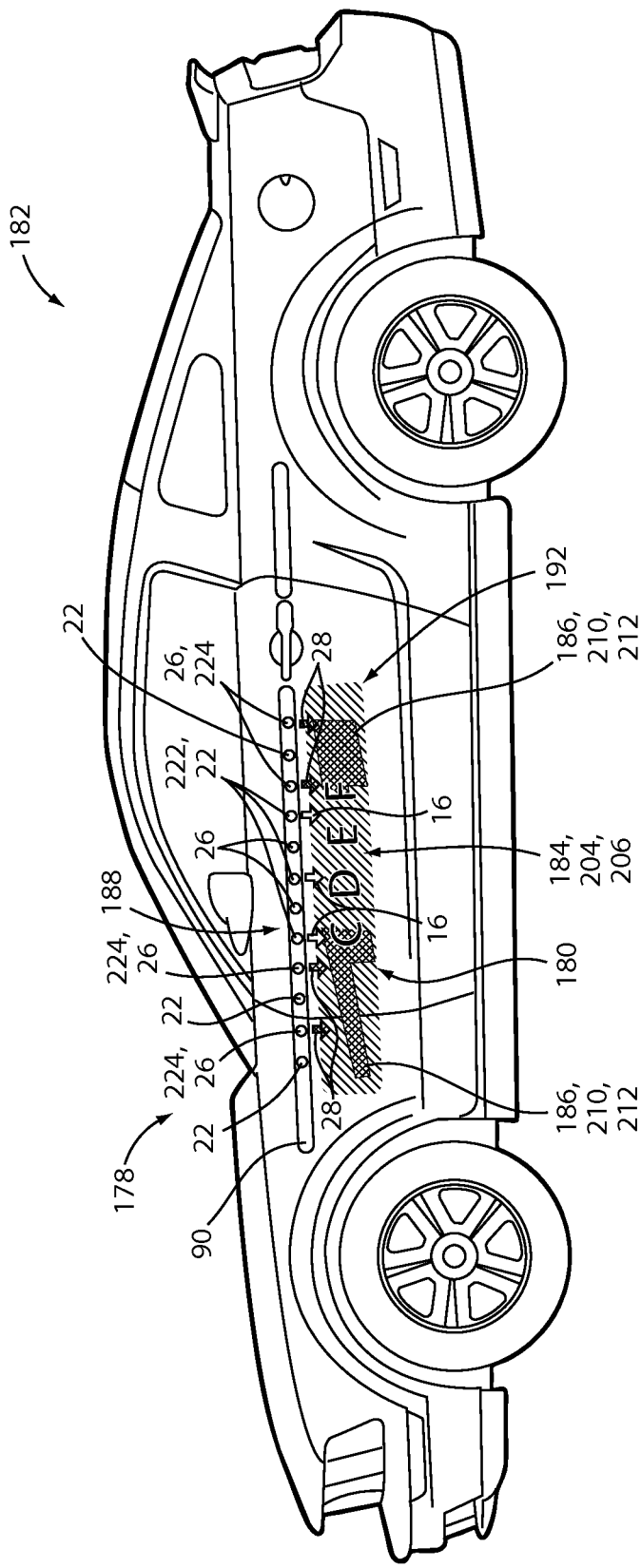
FIG. 9 is a side view of a vehicle comprising a lighting system demonstrating a first photoluminescent graphic and a second photoluminescent graphic illuminated by a plurality of light sources in accordance with the disclosure.

In some implementations, the lighting system 178 may be configured to selectively illuminate each light emitter of the first array of emitters 202 and/or the second array of emitters 208. Referring to FIG. 9, the lighting apparatus 178 is shown illuminating a portion of the first graphic 184 by selectively activating a first selection of emitters 222 of the first array of emitters 202 corresponding to the first light source 22. A portion of the second graphic 186 may also be illuminated by selectively activating a second selection of emitters 224 of the second array of emitters 208 corresponding to the second light source 26. In this configuration, the lighting apparatus 178 may be operable to create a variety of visual effects by illuminating various combinations of emitters to illuminate portions of the first graphic 184 and/or the second graphic 186.

As described herein, a selection of emitters (e.g. 222 and 224) may correspond to one or more contiguous or non-contiguous emitters of each of the arrays of emitters 202 and 208. Some examples of visual effects that may be generated by the lighting system 178 may include sequentially or randomly activating each of the emitters of each of the arrays of emitters 202 and 208 strobing of one or more emitters, and/or flickering various selections of the emitters. Additionally, each emitter may be varied in intensity to vary the intensity of the first emission 22 and/or the third emission 28. In this way, the lighting apparatus 178 may be operable to generate a blending effect of the second emission 206 and the fourth emission 212 from the first photoluminescent portion 204 and the second photoluminescent portion 210, respectively.

For example, the first light source 22 be activated at a first intensity which may be approximately 50% of a total first intensity. In response, the first photoluminescent portion 204 may illuminate the first graphic 184 at approximately 50% of a maximum intensity of the second emission 206. Additionally, the second light source 26 may be activated at a second intensity, which may be approximately 10% of a total second intensity. In response, the second photoluminescent portion 210 may illuminate the second graphic 186 at approximately 10% of a maximum intensity of the fourth emission 212. In this way, the lighting system 178 may be operable to illuminate the first graphic 184 and the second graphic at various intensities to adjust, blend, and/or project lighting in the form of second emission 206 and/or the fourth emission 212 in various combinations. The lighting apparatus may be operable to adjust the intensity of each emitter of the light source 22 and 26 by varying a magnitude and/or a duty cycle of the voltage/current supplied to the light sources 22 and 26 or each individual emitter of the first and second arrays of emitters 202 and 208. In this way, the lighting system 178 may be operable to adjust the brightness or intensity level of light emitted as the first emission 16 and the third emission 28.

In some implementations, the lighting system 178 may further be operable to selectively activate the light source 22 and 26 to illuminate the first graphic and/or the second graphic at various intensities, patterns, and sequences in response to at least one vehicle state. A lighting controller of the lighting system may be in communication with a vehicle control module such that the lighting controller may control the light sources 22 and 26 in response to signals received from the vehicle control module identify a vehicle state. The lighting controller may comprise one or more circuits and/or processors operable to control the light sources 22 and 26 in response to receiving signals from the vehicle controller configured to identify a state of the vehicle 182.

For example, the lighting controller may be operable to control an intensity or illumination level of the light sources 22 and 26 in response to an ambient light condition, a presence detection, or any form of sensory interface. The lighting controller may also selectively activate the light sources 22 and 26 in response to an ignition event, a locking, unlocking actuation, a gear selection, emergency brake actuation, vehicle speed, braking, turn signal, etc. In some implementations, the lighting system 178 may also be configured to selectively illuminate the light sources 22 and 26 in response to a presence or proximity detection of a vehicle key or key fob, and/or a signal from a remote keyless entry device.

The disclosure provides for a lighting system 178 configured to output light from a plurality of photoluminescent portions that may correspond to various symbols and/or graphics on a surface of a vehicle. The various implementations provide for a plurality of photoluminescent materials that may be selectively activated to generate various lighting effects in response to the activation of a plurality of light sources. The system 178 provides various benefits including generating visual effects to improve an appearance of a vehicle, increase value, and provides various safety benefits by improving visibility.

It is to be understood that variations and modifications can be made on the aforementioned structure without departing from the concepts of the present invention, and further it is to be understood that such concepts are intended to be covered by the following claims unless these claims by their language expressly state otherwise.

What is claimed is:

1. An illumination apparatus for a vehicle comprising:
   a surface on a side of the vehicle comprising a first photoluminescent graphic comprising a first absorption range and a second photoluminescent graphic comprising a second absorption range; and
   at least one light source of a light strip separately disposed on the side of the vehicle configured to emit a first emission at a first wavelength, wherein the first wavelength is substantially aligned with the first absorption range to generate a higher level of fluorescence from the first photoluminescent graphic than the second photoluminescent graphic.

2. The illumination apparatus according to claim 1, wherein the first photoluminescent graphic is configured to emit a first color of light and the second photoluminescent graphic is configured to emit a second color of light.

3. The illumination apparatus according to claim 1, wherein the at least one light source corresponds to a first light source and a second light source, the first light source configured to emit the first emission.

4. The illumination apparatus according to claim 3, wherein the second light source is configured to emit a third emission at a second wavelength substantially aligned with the second absorption range.

5. The illumination apparatus according to claim 3, wherein the second photoluminescent graphic is configured to emit a fourth emission in response to receiving the second emission.

6. The illumination apparatus according to claim 3, further comprising:
   a controller in communication with the first and second light sources, wherein the controller is configured to selectively illuminate each of the first and second light sources.

7. The illumination apparatus according to claim 6, wherein the controller is configured to control the first emission and the third emission such that a portion of the first photoluminescent portion is selectively illuminated substantially independent of an illumination of the second photoluminescent portion.

8. A lighting system for a vehicle comprising:
   a panel corresponding to a side surface of the vehicle;
   a light strip configured to emit a first emission; and
   a coating separately disposed on the surface proximate the light strip, the coating comprising at least one photoluminescent portion extending along the surface, wherein the first emission is directed toward the photoluminescent portion such that the photoluminescent portion emits a second emission.

9. The lighting system according to claim 8, wherein the panel corresponds to a trim strip disposed on a panel of the vehicle.

10. The lighting system according to claim 8, wherein the at least one photoluminescent portion corresponds a first photoluminescent graphic and a second photoluminescent graphic.

11. The lighting system according to claim 10, wherein the first photoluminescent graphic comprises a first absorption range, and the second photoluminescent graphic comprises a second absorption range at least partially outside the first absorption range.

12. The lighting system according to claim 11, wherein the light strip comprises to a first light source configured to emit the first emission and a second light source configured to emit a third emission.

13. The lighting system according to claim 12, wherein the first emission is substantially aligned with a peak luminance of the first absorption range and the second emission is substantially aligned with a peak luminance of the second absorption range.

14. The lighting system according to claim 13, wherein the lighting system is configured to selectively illuminate at least a portion of the first photoluminescent graphic independent of the second photoluminescent graphic.

15. A lighting system for a vehicle comprising:
a first light source of a light strip configured to emit a first emission;
a first photoluminescent graphic comprising a first absorption range separately disposed from the light strip on a surface of a side of the vehicle; and
a second photoluminescent graphic comprising a second absorption range disposed on the surface, wherein the first light source is directed toward at least a portion of each of the photoluminescent graphics and configured to excite the first photoluminescent graphic to output a second emission at a greater fluorescence than the second photoluminescent graphic in response to the first emission.

16. The lighting system according to claim 15, further comprising a second light source configured to output a third emission configured to excite the second photoluminescent graphic to output a fourth emission at a greater fluorescence relative to the first photoluminescent graphic in response to the second emission.

17. The lighting system according to claim 16, wherein the first light source comprises a first plurality of emitters configured to output the first emission at a first wavelength and the second light source comprises a second plurality of emitters configured to output the second emission at a second wavelength different than the first wavelength.

18. The lighting system according to claim 17, further comprising a controller operable to selectively activate each of the first plurality of emitters and the second plurality of emitters to selectively excite portions of the first photoluminescent graphic and the second photoluminescent graphic.

19. The lighting system according to claim 18, wherein the first light source and the second light source are distributed along the surface of the vehicle and concealed by a trim panel.

20. The lighting system according to claim 18, wherein the controller is operable to selectively activate each of the first plurality of emitters and the second plurality of emitters to generate at least one of a lighting pattern and a motion effect.

* * * * *